United States Patent [19]
Flannagan et al.

[11] Patent Number: 5,426,381
[45] Date of Patent: Jun. 20, 1995

[54] LATCHING ECL TO CMOS INPUT BUFFER CIRCUIT

[75] Inventors: Stephen T. Flannagan; Lawrence F. Childs, both of Austin, Tex.

[73] Assignee: Motorola Inc., Schaumburg, Ill.

[21] Appl. No.: 247,819

[22] Filed: May 23, 1994

[51] Int. Cl.[6] .................................. H03K 19/01
[52] U.S. Cl. ........................... 326/66; 326/73; 327/215; 365/189.11
[58] Field of Search ............ 326/66, 73; 327/215; 365/189.05, 189.11

[56] References Cited
U.S. PATENT DOCUMENTS

| | | | |
|---|---|---|---|
| 4,806,799 | 2/1989 | Pelley, III et al. | 307/475 |
| 5,003,513 | 3/1991 | Porter et al. | 365/230.08 |
| 5,059,829 | 10/1991 | Flannagan et al. | 307/475 |
| 5,103,121 | 4/1992 | Wendell et al. | 307/475 |
| 5,173,624 | 12/1992 | Gabillard et al. | 307/475 |
| 5,202,855 | 4/1993 | Morton | 365/189.11 X |
| 5,214,317 | 5/1993 | Nguyen | 307/291 |
| 5,331,593 | 7/1994 | Merritt et al. | 365/189.05 X |
| 5,335,553 | 8/1994 | Shiomi | 365/189.11 |
| 5,343,428 | 8/1994 | Pilo et al. | 365/189.05 |
| 5,373,469 | 12/1994 | Akioka et al. | 326/62 X |

*Primary Examiner*—David R. Hudspeth
*Attorney, Agent, or Firm*—Daniel D. Hill

[57] ABSTRACT

A latching ECL to CMOS input buffer (20) has an input buffer (21) for receiving an ECL input signal, a CMOS latch (35), and driver circuits (55, 65). Transmission gates (31, 32) are used to couple the input buffer (21) to the latch (35) in response to a CMOS clock signal being a logic low. The driver circuits (55, 65) are coupled to transmission gates (31, 32). While the clock signal is a logic low, input nodes of the first and second driver circuits (55, 65) are precharged to a relatively high voltage in order to isolate the input signal from the first and second driver circuits (55, 65). The latch (35) both latches the logic state of the ECL input signal and converts the ECL input signal to CMOS logic levels. This allows an input signal to be latched and level converted within a relatively short period of time.

20 Claims, 2 Drawing Sheets

LATCHING ECL TO CMOS INPUT BUFFER CIRCUIT

FIELD OF THE INVENTION

This invention relates generally to circuits, and more particularly, to a latching ECL to CMOS input buffer circuit.

BACKGROUND OF THE INVENTION

An input buffer circuit is a type of circuit that receives an external input signal and isolates the input signal from a load such as peripheral circuits in an integrated circuit memory. The input buffer circuit may also restore the logic levels of the input signal, increase input signal margins, provide increased driving capability, and provide better noise immunity.

The input signal may be of one logic family and the peripheral circuits may be of another logic family. For example, the input signal may be an ECL (emitter-coupled logic) signal, and an internal signal may be a CMOS (complementary metal-oxide semiconductor) level signal. In order to achieve compatibility between the two different logic families, a level conversion circuit converts, or translates, a logic signal from the ECL logic level to the CMOS logic level. A level conversion circuit should not cause excessive delay or consume a large amount of power.

In some applications, such as in a synchronous SRAM (static random access memory), it may be necessary to latch, or register, the input signal in response to a control signal. The input signal may be an address signal or a data signal. The address signal is latched in response to a clock signal. If the synchronous memory is being used as a cache in a data processing system, the clock signal may be provided by the system clock.

Set-up and hold-time specifications for the address signals are typically determined from either a rising edge or a falling edge of the clock signal. The rising edge of the clock signal is the portion of a clock cycle when the clock signal is transitioning from a logic low to a logic high voltage. The falling edge of the clock signal is the portion of a clock cycle when the clock signal is transitioning from a logic high to a logic low. The set-up time is the time that the address signal must be valid prior to the rising edge of the clock signal, in order to ensure that the proper address signal is latched. The hold-time is the time that the address signal must be maintained after the rising edge of the clock signal. The address set-up time plus the address hold-time is the address valid time. In a high speed synchronous SRAM, it is usually desirable that the set-up and hold-times be as short as possible. However, the speed at which an address signal can be buffered, level converted, and latched are determining factors in the length of the set-up and hold-times.

SUMMARY OF THE INVENTION

Accordingly, there is provided, in one form, a latching input buffer circuit, having an input buffer, cross-coupled latch, and a driver circuit. The input buffer has an input terminal for receiving an input signal of a first logic level, and first and second output nodes for providing differential buffered input signals corresponding to the input signal. The cross-coupled latch has first and second input terminals coupled to the first and second output nodes of the input buffer. The cross-coupled latch receives the differential buffered input signals in response to a clock signal being in a first logic state. The cross-coupled latch latches and level converts a logic state of the differential buffered input signals to provide level converted differential signals at first and second output terminals of a second logic level in response to the clock signal being in a second logic state. The driver circuit has first and second input terminals coupled to the first and second output nodes, respectively, of the input buffer. The driver circuit receives the differential buffered input signals in response to the clock signal being in the second logic state and provides first and second output signals at first and second output terminals, respectively, of the driver circuit. These and other features and advantages will be more clearly understood from the following detailed description taken in conjunction with the accompanying drawings.

DESCRIPTION OF A PREFERRED EMBODIMENT

Generally, the present invention provides a latching ECL to CMOS input buffer. This is accomplished by providing an ECL input signal to an ECL buffer circuit, which provides differential buffered input signals. Transmission gates are used to couple the ECL buffer circuit to a cross-coupled latch in response to a CMOS clock signal being a logic low. While the clock signal is a logic low, input nodes of first and second BICMOS driver circuits are precharged to a predetermined voltage in order to isolate the ECL input signal from the first and second driver circuits. The cross-coupled latch both latches the logic state of the ECL input signal and converts the ECL input signal to CMOS logic levels. This allows an input signal to be latched and level converted within a relatively short period of time.

Figure 1:
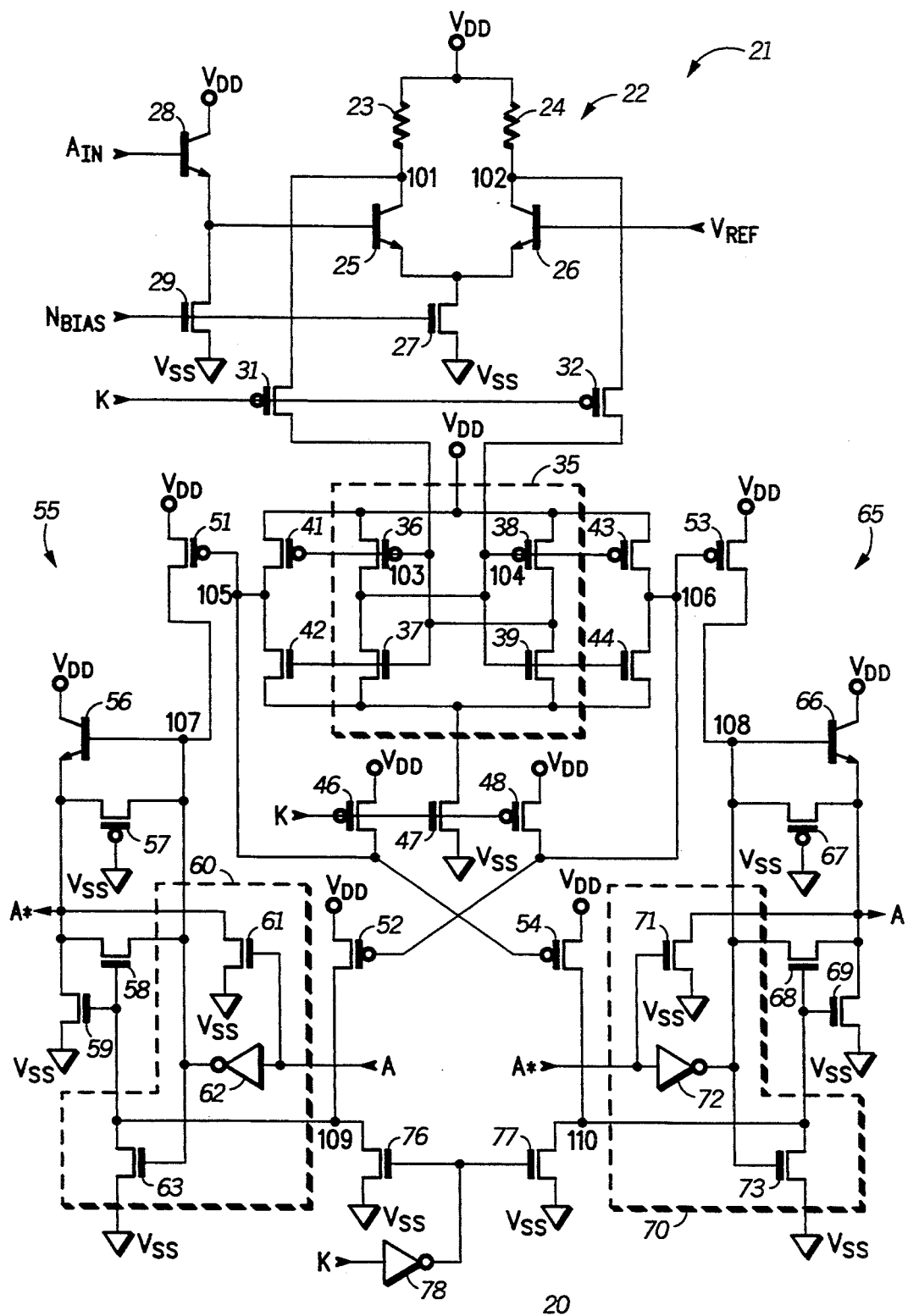
FIG. 1 illustrates in partial schematic diagram form, and partial logic diagram form, a latching ECL to CMOS input buffer circuit in accordance with the present invention.

The present invention can be more fully described with reference to FIG. 1 and FIG. 2. FIG. 1 illustrates in partial schematic diagram form, and partial logic diagram form, latching ECL to CMOS input buffer circuit 20 in accordance with the present invention. Latching input buffer circuit 20 includes input buffer 21, MOS (metal-oxide semiconductor) P-channel transistors 31 and 32, cross-coupled latch 35, BICMOS driver circuits 55 and 65, P-channel transistors 41, 43, 46, 48, 51, 52, 53, 54, and MOS N-channel transistors 42, 44, 47, 76, and 77. Input buffer 21 includes differential amplifier 22, NPN transistor 28, and N-channel transistors 27 and 29. Differential amplifier 22 includes resistors 23 and 24, and NPN transistors 25 and 26. Cross-coupled latch 35 includes P-channel transistors 36 and 38, and N-channel transistors 37 and 39. Driver circuit 55 includes NPN transistor 56, P-channel transistor 57, N-channel transistors 58, 59, 61, and 63, and inverter 62. A keeper circuit 60 in driver circuit 55 includes N-channel transistors 61 and 63, and inverter 62. Driver circuit 65 includes NPN transistor 66, P-channel transistor 67, N-channel transistors 68, 69, 71, and 73, and inverter 72. A keeper circuit 70 in driver circuit 65 includes N-channel transistors 71 and 73 and inverter 72.

NPN transistor 28 has a collector connected to a power supply voltage terminal labeled "$V_{DD}$", a base for receiving an input signal labeled "$A_{IN}$", and an emitter. N-channel transistor 29 has a drain connected to the emitter of NPN transistor 28, a gate for receiving a bias voltage labeled "$N_{BIAS}$", and a source connected to a power supply voltage terminal labeled "$V_{SS}$". Resistor 23 has a first terminal connected to $V_{DD}$, and a second terminal. Resistor 24 has a first terminal connected to $V_{DD}$, and a second terminal. NPN transistor 25 has a collector connected to the second terminal of resistor 23 at output node 101, a base connected to the emitter of NPN transistor 28, and an emitter. NPN transistor 26 has a collector connected to the second terminal of resistor 24 at output node 102, a base for receiving a reference voltage labeled "$V_{REF}$", and an emitter connected to the emitter of NPN transistor 25. N-channel transistor 27 has a drain connected to the emitters of NPN transistors 25 and 26, a gate for receiving bias voltage $N_{BIAS}$, and a source connected to $V_{SS}$.

P-channel transistor 31 has a source connected to node 101, a gate for receiving a clock signal labeled "K", and a drain. P-channel transistor 32 has a source connected to node 102, a gate for receiving clock signal K, and a drain. In a preferred embodiment, P-channel transistors 31 and 32 function as switches or transmission gates. In other embodiments, P-channel transistors 31 and 32 may be replaced with N-channel transistors, parallel coupled N-channel and P-channel transistors, bipolar transistors, or the like. Clock signal K is a CMOS level clock signal. In the illustrated embodiment, a CMOS logic high is equal to about $V_{DD}$, and a CMOS logic low is equal to about $V_{SS}$.

Cross-coupled latch 35 includes a pair of cross-coupled CMOS inverters. In latch 35, P-channel transistor 36 and N-channel transistor 37 are coupled together as one of the inverters, and P-channel transistor 38 and N-channel transistor 39 are coupled together as another inverter. P-channel transistor 36 has a source connected to $V_{DD}$, a gate connected to the drain of P-channel transistor 31, and a drain. N-channel transistor 37 has a drain connected to the drain of P-channel transistor 36, a gate connected to the gate of P-channel transistor 36, and a source. P-channel transistor 38 has a source connected to $V_{DD}$, a gate connected to the drain of P-channel transistor 32, and a drain connected to the gates of transistors 36 and 37. N-channel transistor 39 has a drain connected to the drain of P-channel transistor 38, a gate connected to the gate of P-channel transistor 38 and to the drain of P-channel transistor 36, and a source connected to the source of N-channel transistor 37. The connected gates of transistors 36 and 37 form node 103 and the connected gates of transistors 38 and 39 form node 104. P-channel transistor 41 has a source connected to $V_{DD}$, a gate connected to the gate of P-channel transistor 36, and a drain. N-channel transistor 42 has a drain connected to the drain of P-channel transistor 41 at node 105, a gate connected to the gate of N-channel transistor 37 at node 103, and a source connected to the source of N-channel transistor 37. P-channel transistor 43 has a source connected to $V_{DD}$, a gate connected to the gate of P-channel transistor 38 at node 104, and a drain. N-channel transistor 44 has a drain connected to the drain of P-channel transistor 43 at node 106, and a gate connected to the gate of N-channel transistor 39 at node 104, and a source connected to the source of N-channel transistor 39. N-channel transistor 47 has a drain connected to the sources of N-channel transistors 42, 37, 39, and 44, a gate for receiving clock signal K, and a source connected to $V_{SS}$.

P-channel transistor 51 has a source connected to $V_{DD}$, a gate connected to the drain of P-channel transistor 41 at node 105, and a source. P-channel transistor 46 has a source connected to $V_{DD}$, a gate for receiving clock signal K, and a drain connected to the gate of P-channel transistor 51 at node 105. NPN transistor 56 has a collector connected to $V_{DD}$, a base connected to the drain of P-channel transistor 51 at node 107, and an emitter for providing an output signal labeled "A*". Note that an asterisk (*) after a signal name indicates that the signal is a logical complement of a signal having the same name but lacking the asterisk (*). P-channel transistor 57 has a first drain/source terminal connected to the emitter of NPN transistor 56, a second drain/source terminal connected to the base of NPN transistor 56 at node 107, and a base connected to $V_{SS}$. N-channel transistor 59 has a drain connected to the emitter of NPN transistor 56, a gate, and a source connected to $V_{SS}$. N-channel transistor 58 has a first drain/source terminal connected to the drain of N-channel transistor 59, and a gate connected to the gate of N-channel transistor 59 at node 107, and a second drain/source terminal connected to the base of NPN transistor 56. N-channel transistor 63 has a drain connected to the gates of both N-channel transistors 59 and 58, and a gate connected to the base of NPN transistor 56 at node 107, and a source connected to $V_{SS}$. N-channel transistor 61 has a drain connected to the drain of N-channel transistor 59, a gate for receiving an output signal labeled "A", and a source connected to $V_{SS}$. Inverter 62 has an input terminal connected to the gate of N-channel transistor 61, and an output terminal connected to the base of NPN transistor 56 at node 107. N-channel transistor 76 has a drain connected to the drain of N-channel transistor 63 at node 109, a gate, and a source connected to $V_{SS}$. P-channel transistor 52 has a source connected to $V_{DD}$, a gate connected to the drain of P-channel transistor 48, and a drain connected to the drain of N-channel transistor 76 at node 109.

P-channel transistor 53 has a source connected to $V_{DD}$, a gate connected to the drains of P-channel transistors 43 and 48 at node 106, and a drain. P-channel transistor 48 has a source connected to $V_{DD}$, a gate for receiving clock signal K, and a drain connected to the drain of P-channel transistor 46 at node 105. NPN transistor 66 has a collector connected to $V_{DD}$, a base connected to the drain of P-channel transistor 53 at node 108, and an emitter for providing output signal A. P-channel transistor 67 has a first drain/source terminal connected to the base of NPN transistor 66 at node 108, a second drain/source terminal connected to the emitter of NPN transistor 66, and a gate connected to $V_{SS}$. N-channel transistor 68 has a first drain/source terminal connected to the base of NPN transistor 66 at node 108, a second drain/source terminal connected to the emitter of NPN transistor 66, and a gate. N-channel transistor 69 has a drain connected to the emitter of NPN transistor 66, a gate connected to the gate of N-channel transistor 68, and a source connected to $V_{SS}$. P-channel transistor 54 has a source connected to $V_{DD}$, a gate connected to the drain of P-channel transistor 46 at node 105, and a drain connected to the gates of N-channel transistors 68 and 69 at node 110. N-channel transistor 73 has a drain connected to the drain of P-channel transistor 54 at node 110, a gate connected to the base of NPN transistor 66 at node 108, and a source connected to $V_{SS}$. N-channel transistor 71 has a drain connected to the emitter of NPN transistor 66, a gate for receiving output signal A*, and a source connected to $V_{SS}$. Inverter 72 has an input terminal for receiving output signal A*, and an output terminal connected to the base of NPN transistor 66 at node 108. N-channel transistor 77 has a drain connected to the drain of P-channel transistor 54 at node 110, a gate connected to the gate of N-channel transistor 76, and a source connected to $V_{SS}$. Inverter 78 has an input terminal for receiving clock signal K, and an output terminal connected to the gates of N-channel transistors 76 and 77.

Latching input buffer circuit 20 utilizes both rising and falling edges of clock signal K. A precharge cycle begins on the falling edge of clock signal K, and a drive/latch cycle begins on the rising edge of clock signal K.

The ECL input signal $A_{IN}$ is provided to the base of NPN transistor 28 and buffered differential signals corresponding to input signal $A_{IN}$ are provided at nodes 101 and 102. In the illustrated embodiment, an ECL logic high is equal to about −0.8 volts and an ECL logic low is equal to about −1.6 volts. However, in other embodiments, logic levels having relatively small signal swings (for example, less than one volt) may be provided to the base of NPN transistor 28. For example, latching input buffer circuit 20 may be used as a sense amplifier to amplify a small differential signal (such as from a bit line pair) for a cache in a data processing system. Note that in a sense amplifier application, input buffer 21 may not be necessary. NPN emitter-follower transistor 28 reduces the level of input signal $A_{IN}$ by about one $V_{BE}$ (a base-to-emitter diode voltage drop), and couples input signal $A_{IN}$ to differential amplifier 22. Reference voltage $V_{REF}$ is provided at about the midpoint of the logic swing of the signal provided to NPN transistor 25 of differential amplifier 22. When the signal provided to the base of NPN transistor 25 is higher than reference voltage $V_{REF}$, more current is steered through NPN transistor 25 than through NPN transistor 26, causing a voltage at node 101 to be lower than a voltage at node 102. On the other hand, when the signal provided to the base of NPN transistor 25 is lower than reference voltage $V_{REF}$, more current is steered through NPN transistor 26 than through NPN transistor 25, causing a voltage at node 102 to be lower than a voltage at node 101. N-channel transistors 29 and 27 provide relatively constant current sources for transistor 28 and differential amplifier 22, respectively. Buffered differential signals having a logic state corresponding to the logic state of single-ended input signal $A_{IN}$ are provided at nodes 101 and 102.

The falling edge of clock signal K begins a precharge cycle. When clock signal K is a logic low voltage, P-channel transistors 31 and 32 are conductive, the buffered differential signals at nodes 101 and 102 are provided to latch 35. Latch 35 is a CMOS latch having a pair of cross-coupled inverters. A logic state is latched in latch 35 on a rising edge of clock signal K. The logic low clock signal K causes P-channel transistors 46 and 48 to be conductive and precharges nodes 105 and 106 to about $V_{DD}$. P-channel transistors 51, 52, 53, and 54 are substantially non-conductive, which isolates driver circuits 55 and 65 from latch 35, preventing the logic level stored in latch 35 from potentially affecting the logic level of output signals A and A*. The output terminal of inverter 78 provides a logic high voltage to the gates of N-channel transistors 76 and 77. N-channel transistors 76 and 77 are conductive, which discharges nodes 109 and 110, respectively, in order to prevent both of transistors 56 and 59 or 66 and 69 from being conductive at the same time. For example, if NPN transistor 56 is conductive at the same time as N-channel transistor 59, an undesirable "crowbar" current flows between $V_{DD}$ and $V_{SS}$ through NPN transistor 56 and N-channel transistor 59. A crowbar current unnecessarily increases power consumption of the integrated circuit.

Driver circuits 55 and 65 are disconnected from nodes 105 and 106 during the precharge cycle, and keeper circuit 60 maintains the logic state of driver circuit 55. Likewise, keeper circuit 70 maintains the logic state of driver circuit 65 when clock signal K is a logic low. The sizes of the transistors of keeper circuits 60 and 70 are relatively small, and are just large enough to maintain the logic states of the driver circuits during the precharge cycle. Also, when increasing the output voltage of driver circuit 55 or 65, whichever applies, it is easier to pull against a small keeper transistor rather than a larger drive transistor.

The rising edge of clock signal K defines a drive/latch cycle. When clock signal K becomes a logic high voltage, P-channel transistors 31 and 32 are substantially non-conductive, which isolates latch 35 from input buffer circuit 21. If input signal $A_{IN}$ changes logic states while clock signal K is a logic high voltage, the logic state stored in latch 35 is unaffected. The logic state provided to latch 35 when clock signal K was a logic low is latched when clock signal K becomes a logic high voltage. P-channel transistors 51, 52, 53, and 54 are conductive, which couple latch 35 to driver circuits 55 and 65. N-channel transistor 47 becomes conductive, which then provides a current source for latch 35, and transistors 41, 42, 43, and 44. The voltage of either of nodes 103 and 104, whichever is a logic low voltage will be reduced to about the potential of $V_{SS}$. Node 105 is driven to the logic state of node 103 by transistors 41 and 42, and node 106 is driven to the logic state of node 104 by transistors 43 and 44. Transistors 36, 37, 38, and 39 are of relatively small size. Transistors 41, 42, 43, and 44 are larger than transistors 36, 37, 38, and 39 to provide added drive capability for more quickly changing the logic states of nodes 105 and 106 when clock signal K transitions to a logic high.

P-channel transistors 57 and 67, and N-channel transistors 58 and 68 are provided for discharging the bases of NPN transistors 56 and 66. P-channel transistors 57 and 67 are for preventing NPN transistors 56 and 66, respectively, from operating in saturation. If a bipolar transistor operates in saturation, it may take a relatively long time for the bipolar transistor to recover from the saturated state, thus decreasing the operating speed of the integrated circuit memory. Also, a saturated bipolar transistor may be unable to switch conductive states, causing the circuit to fail. In order to receive the benefit of fast operating speeds, each bipolar transistor in the circuit typically should be operated in its nonsaturation region.

As an example, if ECL input signal $A_{IN}$ is a logic high, the voltage of input signal $A_{IN}$ is higher than the reference voltage $V_{REF}$, and more current is steered through NPN transistor 25 than through NPN transistor 26. Node 101 is a logic low and node 102 is a logic high. When CMOS clock signal K is provided as a logic low, P-channel transistors 31 and 32 will be conductive, coupling node 101 to node 103 and node 102 to node 104. Node 103 will be a logic low and node 104 will be a logic low. Latch 35 receives the logic states of nodes 103 and 104, but the logic states are not latched until clock signal K becomes a logic high. P-channel transistors 46 and 48 are conductive when clock signal K is a logic low, which precharges both of nodes 105 and 106 to about $V_{DD}$. N-channel transistors 76 and 77 are conductive, causing nodes 109 and 110 to be discharged to $V_{SS}$. P-channel transistors 51, 52, 53, and 54 are nonconductive, isolating driver circuits 55 and 65 from latch 35. Keeper circuits 60 and 70 maintain the logic states of output signals A and A* at their previous logic states.

When clock signal K transitions to a logic high, P-channel transistors 31 and 32 become substantially non-conductive, isolating latch 35 from input buffer 21. P-channel transistors 46 and 48 become substantially non-conductive and N-channel transistor 47 becomes conductive. Increased current flow through latch 35 causes the logic low state of node 103 and the logic high state of node 104 to be latched in latch 35. Transistors 36, 37, 41, and 42 maintain the precharged state of node 105 as a logic high, and transistors 38, 39, 43, and 44 interact to reduce the precharged state of node 106 to a logic low. The logic low at node 106 causes P-channel transistors 53 and 52 to be conductive. Node 108 becomes a logic high, which causes NPN transistor 66 to be conductive. NPN transistor 66 increases the voltage of output signal A to a logic high. P-channel transistor 52 causes node 109 to be increased to a logic high. N-channel transistor 59 is conductive, which reduces the voltage of output signal A* to a logic low. Note that N-channel transistors 76 and 77 are substantially non-conductive when clock signal K is a logic high.

Output signal A is provided to both the input terminal of inverter 62 and N-channel transistor 61 of keeper circuit 60, and output signal A* is provided to both the input terminal of inverter 72 and N-channel transistor 71 of keeper circuit 70. When clock signal K transitions to a logic low to begin another precharge cycle, keeper circuit 60 maintains output signal A* as a logic low and keeper circuit 70 maintains output signal A as a logic high. The logic low clock signal K causes N-channel transistors 76 and 77 to be conductive, reducing the voltage of nodes 109 and 110 to $V_{SS}$. N-channel transistor 59 becomes substantially non-conductive. The logic high output signal A causes N-channel transistor 61 to be conductive, and N-channel transistor 63 to be substantially non-conductive, thus maintaining output signal A* at a logic low voltage. In driver circuit 65, the logic low output signal A* causes N-channel transistor 71 to be non-conductive, and N-channel transistor 73 to be conductive. N-channel transistors 68 and 69 are substantially non-conductive. The logic high at the output terminal of inverter 72 maintains a logic high at node 108, resulting in NPN transistor 66 holding output signal A at a logic high voltage.

Because a logic low clock signal K is used to turn off driver circuits 55 and 65 during a precharge cycle, a crowbar current is eliminated. Also, the output terminals of driver circuits 55 and 65 can transition more quickly because NPN transistors 56 and 66 only have to pull-up against the relatively small keeper circuits 60 and 70, respectively. In addition, integrating the latching and level conversion functions in latch 35 allows an input signal to be latched and level converted within a relatively period of time.

Figure 2:
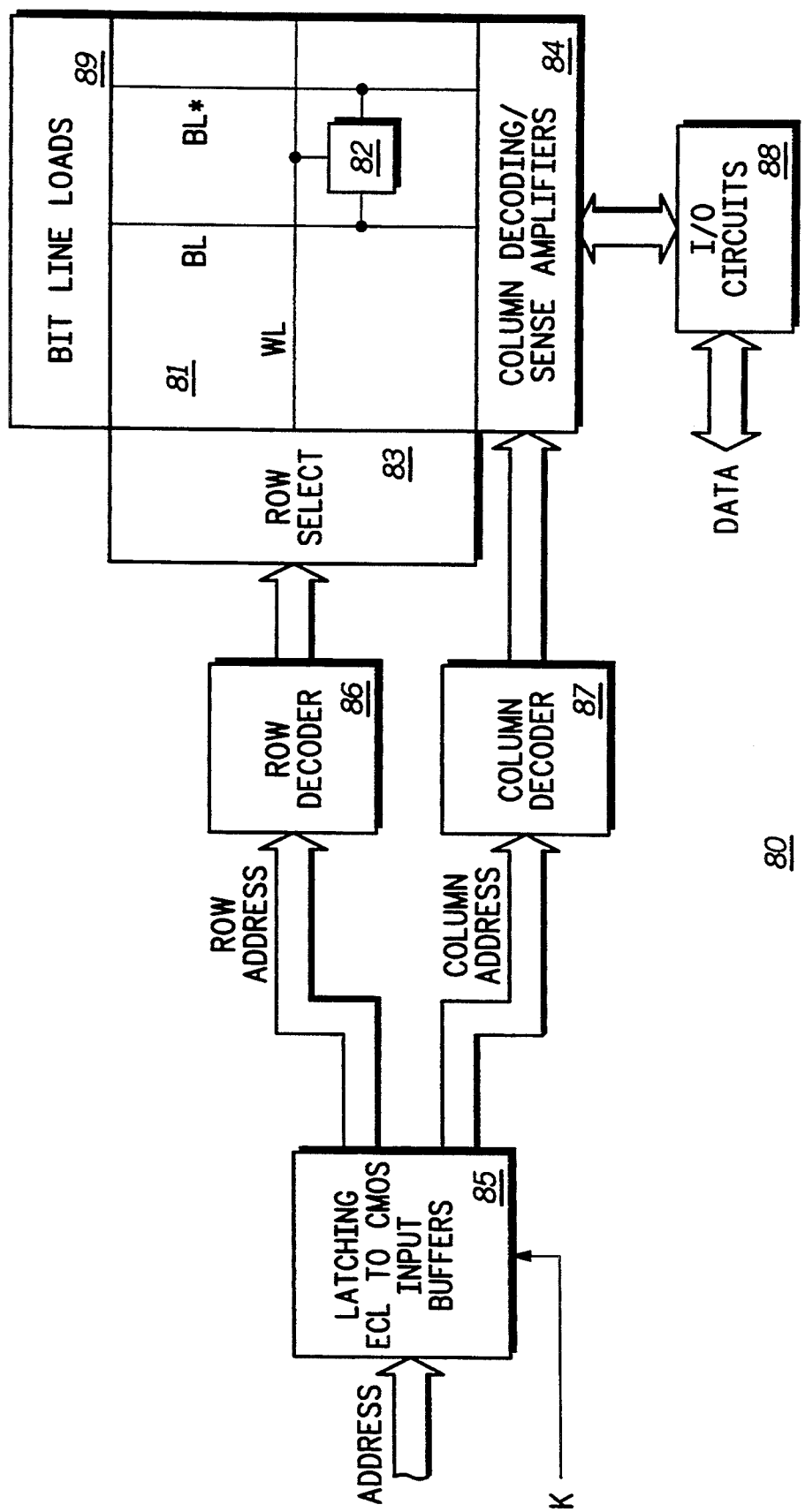
FIG. 2 illustrates in block diagram form, a memory in accordance with the present invention.

FIG. 2 illustrates in block diagram form, a memory in accordance with the present invention. Memory 80 is a synchronous integrated circuit SRAM implemented in BICMOS. A BICMOS integrated circuit is a circuit that includes bipolar transistors and CMOS (complementary metal-oxide semiconductor) transistors on the same integrated circuit. Memory 80 includes memory array 81, row select 83, column decoding/sense amplifiers 84, latching ECL to CMOS input buffers 85, row decoders 86, column decoders 87, data input/output (I/O) circuits 88, and bit line loads 89.

Memory array 81 includes a plurality of memory cells, such as memory cell 82, organized in rows and columns. A word line and the memory cells coupled to the word line comprise a row of memory cells. A bit line pair and the memory cells coupled to the bit line pair comprise a column of memory cells. Each memory cell is a conventional four transistor SRAM cell having polysilicon load resistors. However, the memory cells may also be six transistor SRAM cells using P-channel transistors as pull-up devices instead of polysilicon load resistors. A memory cell is located at each intersection of the word lines and the bit line pairs. For example, memory cell 82 is coupled to a word line labeled "WL", and to a bit line pair labeled "BL" and "BL*". The memory cells of array 81 are addressable through row decoding and column decoding, and each memory cell has a unique address at an intersection of a row and a column. Each word line is coupled to row select 83, and each bit line is coupled between bit line loads 89 and column decoding/sense amplifiers 84.

Latching ECL to CMOS input buffers 85 includes a plurality of latching input buffer circuits 20. One latching input buffer circuit 20 is used for each address signal received by memory 80. Latching ECL to CMOS input buffers 85 has a plurality of first input terminals for receiving address signals labeled "ADDRESS", a second input terminal for receiving a clock signal labeled "K", and a plurality of output terminals for providing a row address labeled "ROW ADDRESS" and a column address labeled "COLUMN ADDRESS". Row decoder 86 has a plurality of input terminals for receiving row address ROW ADDRESS, and a plurality of output terminals coupled to input terminals of row select. Column decoder 87 has a plurality of input terminals for receiving column address COLUMN ADDRESS, and a plurality of output terminals coupled a plurality of input terminals of column decoding/sense amplifiers 84. Note that the amount of decoding and predecoding provided by the row and column decoders may be different in other embodiments, and is not important for describing the invention.

Data I/O circuits 88 has a plurality of terminals for providing and for receiving data signals labeled "DATA", and is coupled to column decoding/sense amplifiers 84.

To read a data bit from a memory cell, such as memory cell 82, an address is provided to latching ECL to CMOS input buffers 85. The address is latched in latching ECL to CMOS input buffers 85 in response to a rising edge of clock signal K, and the address is provided to row decoders 86 and column decoders to select a word line and a bit line pair. Word line drivers (not shown) drive the voltage of the word line to a logic high, which selects the row of memory cells. Column decoding/sense amplifiers 84 couple the bit line pair to a sense amplifier. The data bit stored in the selected memory cell exists as a relatively small differential voltage on the pair of complementary bit lines. The sense amplifier detects and amplifies the differential voltage and communicates it to I/O circuits 88.

During a write cycle of memory 80, the flow of data is essentially reversed. An address is provided to latching ECL to CMOS input buffers 85. The address is latched in latching ECL to CMOS input buffers 85 in response to a rising edge of clock signal K, and the address is provided to row decoder 86 and column decoder 87 to select a word line and a bit line pair. Word line drivers (not shown) drive the voltage of the word line to a logic high, which selects the row of memory cells. A data signal DATA is provided to I/O circuit 88, which provides a corresponding data signal to a selected bit line pair. A voltage differential is driven onto the selected bit line pair which writes a data bit into the memory cell. At the end of a write cycle the differential voltage on the bit line pair is reduced to a level small enough to prevent the data from being erroneously written into a memory cell during the following read cycle. Equalization and precharge (write recovery) of the bit line pairs is achieved by bit line loads 89.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

What is claimed is:

1. A latching input buffer circuit, comprising:
   an input buffer having an input terminal for receiving an input signal of a first logic level, and first and second output nodes for providing differential buffered input signals corresponding to the input signal;
   a cross-coupled latch having first and second input terminals coupled to the first and second output nodes of the input buffer, for receiving the differential buffered input signals in response to a clock signal being in a first logic state, the cross-coupled latch for latching and level converting a logic state of the differential buffered input signals to provide level converted differential signals at first and second output terminals of a second logic level in response to the clock signal being in a second logic state; and
   a driver circuit having first and second input terminals coupled to the first and second output nodes, respectively, of the input buffer, the driver circuit receiving the differential buffered input signals in response to the clock signal being in the second logic state and providing first and second output signals at first and second output terminals, respectively, of the driver circuit.

2. The latching input buffer circuit of claim 1, wherein the first logic level is characterized as being an ECL level, and the second logic level is characterized as being a CMOS logic level.

3. The latching input buffer circuit of claim 1, further comprising:
   a first transistor having a first current electrode coupled to the first output node of the input buffer, a second current electrode coupled to both the first input terminal and to the second output terminal of the cross-coupled latch, and a control electrode for receiving the clock signal; and a second transistor having a first current electrode coupled to the second output node of the input buffer, a second current electrode coupled to both the second input terminal and to the second output terminal of the cross-coupled latch, and a control electrode for receiving the clock signal.

4. The latching input buffer circuit of claim 1, further comprising means for isolating the first and second output nodes of the input buffer from the driver circuit, and for precharging the first and second output terminals of the cross-coupled latch when the clock signal is in the first logic state.

5. The latching input buffer circuit of claim 1, further comprising a keeper circuit, coupled to the driver circuit, for maintaining a logic state of the first and second output signals.

6. The latching input buffer circuit of claim 1, wherein the clock signal is provided at CMOS logic levels, the first logic state being a CMOS logic low and the second logic state being a CMOS logic high.

7. The latching input buffer circuit of claim 1, wherein the input signal is characterized as being an address signal in an integrated circuit memory.

8. A latching ECL to CMOS input buffer circuit, comprising:
   an ECL input buffer having an input terminal for receiving an ECL level input signal, and first and second output nodes for providing buffered differential input signals corresponding to the input signal;
   a first transmission gate having a first terminal coupled to the first output node of the ECL input buffer, a second terminal, and a control terminal for receiving a CMOS level clock signal;
   a second transmission gate having a first terminal coupled to the second output node of the ECL input buffer, a second terminal, and a control terminal for receiving the CMOS level clock signal;
   a cross-coupled latch having a first input terminal coupled to the second terminal of the first transmission gate, a second input terminal coupled to the second terminal of the second transmission gate, the cross-coupled latch for receiving the buffered differential input signals in response to the CMOS level clock signal being in a logic low state, the cross-coupled latch for latching and level converting a logic state of the buffered differential input signals to provide CMOS level differential signals at first and second output terminals in response to the CMOS level clock signal being in a logic high state;
   a driver circuit having first and second input terminals coupled to the second and first output terminals of the cross-coupled latch, respectively, the driver circuit receiving the CMOS level differential signals in response to the clock signal being in the logic high state and providing first and second CMOS output signals at first and second output terminals, respectively, of the driver circuit;
   isolation means, coupled between the driver circuit and the cross-coupled latch, for isolating the driver circuit from the cross-coupled latch in response to the clock signal being in the logic low state; and
   a keeper circuit, coupled to the driver circuit, for maintaining a logic state of the first and second CMOS output signals when the clock signal is in the logic low state.

9. The latching ECL to CMOS input buffer circuit of claim 8, wherein the first and second transmission gates comprise first and second P-channel transistors, respectively.

10. The latching ECL to CMOS input buffer circuit of claim 8, wherein the cross-coupled latch comprises a pair of cross-coupled CMOS inverters.

11. The latching ECL to CMOS input buffer circuit of claim 10, further comprising a first MOS transistor, coupled to the pair of cross-coupled inverters, for providing a current source for the cross-coupled CMOS inverters in response to the clock signal being in the logic high state.

12. The latching ECL to CMOS input buffer circuit of claim 11, further comprising:
 a first P-channel transistor having a source coupled to a first power supply voltage terminal, a gate coupled to the second terminal of the first transmission gate, and a drain;
 a first N-channel transistor having a drain coupled to the drain of the first P-channel transistor, a gate coupled to the second terminal of the first transmission gate, and a source coupled to the first MOS transistor;
 a second P-channel transistor having a source coupled to the first power supply voltage terminal, a gate coupled to the second terminal of the second transmission gate, and a drain; and
 a second N-channel transistor having a drain coupled to the drain of the second P-channel transistor, a gate coupled to the second terminal of the second transmission gate, and a source coupled to the first MOS transistor.

13. The latching ECL to CMOS input buffer circuit of claim 12, wherein the isolation means comprises:
 a third P-channel transistor having a source coupled to the first power supply voltage terminal, a gate coupled to the drain of the first P-channel transistor, and a drain coupled to the first input terminal of the driver circuit;
 a fourth P-channel transistor having a source coupled to the first power supply voltage terminal, a gate for receiving the CMOS clock signal, and a drain coupled to the drain of the first P-channel transistor;
 a fifth P-channel transistor having a source coupled to the first power supply voltage terminal, a gate coupled the drain of the second P-channel transistor, and a drain coupled to the second input terminal of the driver circuit;
 a sixth P-channel transistor having a source coupled to the first power supply voltage terminal, a gate for receiving the CMOS clock signal, and a drain coupled to the drain of the second P-channel transistor;
 a seventh P-channel transistor having a source coupled to the first power supply voltage terminal, a gate coupled to the drain of the sixth P-channel transistor, and a drain; and
 an eighth P-channel transistor having a source coupled to the first power supply voltage terminal, a gate coupled to the drain of the fourth P-channel transistor, and a drain.

14. The latching ECL to CMOS input buffer circuit of claim 13, further comprising:
 a third N-channel transistor having a drain coupled to the drain of the seventh P-channel transistor, a gate, and a source coupled to the second power supply voltage terminal;
 a fourth N-channel transistor having a drain coupled to the drain of the eighth P-channel transistor, a gate coupled to the gate of the third N-channel transistor, and a source coupled to the second power supply voltage terminal; and
 a first inverter having an input terminal for receiving the CMOS clock signal, and an output terminal coupled to the gates of the third and fourth N-channel transistors.

15. The latching ECL to CMOS input buffer circuit of claim 14, wherein the driver circuit comprises:
 an NPN transistor having a collector coupled to the first power supply voltage terminal, a base coupled to the drain of the third P-channel transistor, and an emitter for providing the first CMOS output signal; and
 a fifth N-channel transistor having a drain coupled to the emitter of the NPN transistor, a gate coupled the drain of the third N-channel transistor, and a source coupled to the second power supply voltage terminal.

16. The latching ECL to CMOS input buffer circuit of claim 15, wherein the keeper circuit comprises:
 a sixth N-channel transistor having a drain coupled to the emitter of the NPN transistor, a gate for receiving the second CMOS output signal, and a source coupled to the second power supply voltage terminal;
 a seventh N-channel transistor having a drain coupled to the gate of the fifth N-channel transistor, a gate coupled to the base of the NPN transistor, and a source coupled to the second power supply voltage terminal; and
 a second inverter having an input terminal for receiving the second CMOS output signal, and an output terminal coupled to both the base of the NPN transistor and to the gate of the seventh N-channel transistor.

17. A synchronous static random access memory, comprising:
 a plurality of memory cells arranged in rows and columns, each memory cell coupled to a word line and to a bit line pair;
 a row decoder, coupled to the plurality of memory cells, for selecting the word line in response to a row address;
 a column decoder, coupled to the plurality of memory cells, for selecting the bit line pair in response to a column address; and
 a plurality of latching ECL to CMOS input buffer circuits, coupled to the row decoder and to the column decoder, for receiving a plurality of address signals, and a clock signal, each one of the plurality of latching ECL to CMOS input buffer circuits comprising:
  an ECL input buffer having an input terminal for receiving an ECL level address signal, and first and second output nodes for providing differential buffered input signals corresponding to the ECL level input signal;
  a cross-coupled latch having first and second input terminals coupled to the first and second output nodes of the ECL input buffer, for receiving the differential buffered input signals in response to a clock signal being a logic low, the cross-coupled latch for latching and level converting a logic state of the differential buffered input signals to provide level converted differential signals at first and second output terminals in response to the clock signal being a logic high; and a driver circuit having first and second input terminals coupled to the first and second output nodes of the input buffer, respectively, the driver circuit receiving the differential buffered input signals in response to the clock signal being a logic high and providing first and second CMOS output signals at first and second output terminals, respectively, of the driver circuit.

18. The synchronous static random access memory of claim 17, further comprising:

a first transmission gate having a first terminal coupled to the first output node of the ECL input buffer, a second terminal, and a control terminal for receiving the clock signal; and a second transmission gate having a first terminal coupled to the second output node of the ECL input buffer, a second terminal, and a control terminal for receiving the clock signal.

19. The synchronous static random access memory of claim 18, further comprising isolation means, coupled between the driver circuit and the first and second transmission gates, for isolating the driver circuit from the differential buffered input signals in response to the clock signal being in the first logic state.

20. The synchronous static random access memory of claim 19, further comprising a keeper circuit, coupled to the driver circuit, for maintaining a previous logic state of the first and second CMOS output signals when the clock signal is in the second logic state.

* * * * *